United States Patent [19]
Tochio et al.

[11] Patent Number: 5,911,061
[45] Date of Patent: Jun. 8, 1999

[54] PROGRAM DATA CREATING METHOD AND APPARATUS FOR USE WITH PROGRAMMABLE DEVICES IN A LOGIC EMULATION SYSTEM

[75] Inventors: Tatsuya Tochio, Ebina; Osamu Tada, Hadano; Toshio Oguma, Ebina; Kazunobu Morimoto, Hadano; Mototsugu Fujii, Ebina, all of Japan

[73] Assignee: Hitachi, Ltd., Tokyo, Japan

[21] Appl. No.: 08/692,626

[22] Filed: Aug. 6, 1996

[30] Foreign Application Priority Data

Aug. 7, 1995 [JP] Japan ................................. 7-200613

[51] Int. Cl.$^6$ ...................................................... G06F 17/00
[52] U.S. Cl. ........................................................ 395/500.44
[58] Field of Search ........................... 395/500; 364/488, 364/489, 490, 491, 578

[56] References Cited

U.S. PATENT DOCUMENTS

| | | | |
|---|---|---|---|
| 5,452,239 | 9/1995 | Dai et al. ................................. | 364/578 |
| 5,513,119 | 4/1996 | Moore et al. ............................ | 364/491 |
| 5,581,742 | 12/1996 | Lin et al. ................................. | 395/500 |
| 5,623,418 | 4/1997 | Rostoker et al. ........................ | 364/489 |
| 5,666,289 | 9/1997 | Watkins ................................... | 364/491 |

OTHER PUBLICATIONS

Walters, Reprogrammable hardware Emulation for ASICs Makes Thorough Design Verification Practical, IEEE, pp. 484–486, Feb. 27, 1989.

Lo et al, Hardware Emulation Board Based on FPGAs and Programmable Interconnections, IEEE, pp. 126–130, Jun., 1994.

Wieler et al, Using an FPGA Based Computer as a Hardware Emulator for Built–In Self–Test Structures, IEEE, pp. 16–21, Jun. 1994.

Walters, Computer–Aided Prototyping for ASIC–Based Systems, IEEE, pp. 4–10, Jun. 1991.

*Primary Examiner*—Kevin J. Teska
*Assistant Examiner*—Matthew Loppnow
*Attorney, Agent, or Firm*—Fay,Sharpe ,Beall, Fagan,Minnich & McKee

[57] ABSTRACT

A program data creating method and apparatus for use with programmable devices in a logic emulation system provides high-speed logic emulation of an LSI for logic and function verification. The logic data defining the logic circuits of the LSI is divided into a plurality of unit blocks in a layout analogous to the floor plan represented by floor plan information for the LSI. The unit blocks are allocated to the programmable devices automatically. The names of the signals defined within the design data regarding the LSI are made to correspond with the names of the signals in effect when the design data is deployed within the programmable devices, after optimization of the logic. This allows the program data for the programmable devices to be created and corrected using the signal names as set forth in the design data.

15 Claims, 13 Drawing Sheets

| BLOCK NAME (521) | I/O TERMINAL COUNT (522) | LOGIC SCALE (523) | BLOCK LOCATION (524) |
|---|---|---|---|
| B 1 | 45 | 3.5 kG | R < 1-8 >, C < 1-2 > |
| B 2 | 30 | 5.6 | R < 1-8 >, C < 1-2 > |
| B 3 | 35 | 3.7 | R < 1-8 >, C < 1-2 > |
| ⋮ | ⋮ | ⋮ | ⋮ |
|  | 130 | 35.5kG | — |

525 TOTAL LOGIC SCALE
526 TOTAL I/O TERMINAL COUNT

FIG. 4

| DEVICE TYPE (531) | I/O TERMINAL COUNT (532) | LOGIC SCALE (533) | MOUNTABLE DEVICE COUNT (534) |
|---|---|---|---|
| P D 1 | 50 | 1 kG | 36 |
| P D 2 | 63 | 1.5 | 25 |
| P D 3 | 80 | 2 | 20 |
| ⋮ | ⋮ | ⋮ | ⋮ |

FIG. 5

| DEVICE TYPE (541) | MOUNTED DEVICE COUNT (542) | MOUNTED DEVICE NAME (543) | ACTIVITY RATIO (544) | I/O TERMINAL COUNT (545) |
|---|---|---|---|---|
| P D 1 | 36 | P D 1 1 1<br>P D 1 1 2<br>⋮ | 70<br>80 | 47<br>43 |
| P D 2 | 24 | P D 2 1 1<br>⋮ | 85 | |

FIG. 6

| BLOCK NAME (551) | SIGNAL NAME (552) | CONVERTED SIGNAL NAME (553) |
|---|---|---|
| B 1 | S 1 0 0 1<br>S 1 0 0 2<br>S 1 0 0 3<br>⋮ | S 1 0 0 1 #<br>S 1 0 0 2 #<br>—<br>⋮ |

FIG. 7

| SIGNAL NAME | WIRING PATH | DELAY TIME |
|---|---|---|
| S1001 | ~S3018 | 185ns |
| | ~S3018 | 102 |
| | ~S3018 | 232 |
| | ⋮ | |

FIG. 8

| NETWORK NAME | SOURCE DEVICE NAME | SINK DEVICE NAME |
|---|---|---|
| N001 | PD111 | PD112 |
| N002 | PD112 | PD122 |
| N003 | PD131 | PD134 |
| ⋮ | ⋮ | ⋮ |

FIG. 9

| GATE NAME | INPUT TERMINAL NAME | OUTPUT TERMINAL NAME |
|---|---|---|
| BUF001 | PI001 | PO001 |
| AND002 | PI002 | PO002 |
| OR 003 | PI003 | PO003 |
| ⋮ | ⋮ | ⋮ |

FIG. 10

PROGRAM DATA CREATING METHOD AND APPARATUS FOR USE WITH PROGRAMMABLE DEVICES IN A LOGIC EMULATION SYSTEM

FIELD OF THE INVENTION

The present invention relates to a logic emulation system for verifying the performance and functioning of LSI's. More particularly, the invention relates to a logical emulation system for verifying the performance and function of a target LSI by developing a prototype of an LSI with programmable devices.

BACKGROUND OF THE INVENTION

In the logic design phase of an LSI, verification of the LSI logic is critically important. This is because a serious logic defect, if detected after the logic design has been implemented in a chip, requires remaking the mask thereby increasing the fabrication cost and also the time required for the development of an LSI.

Logic simulation is prevalent in the industry and is used as the traditional technique for LSI logic verification. However, this technique has the following disadvantages:

(A) To verify LSI's having a large logic scale requires tremendous amounts of calculation time.

(B) The calculation time is prolonged when time-consuming logic operations such as testing the communication of the LSI with a network is simulated.

(C) It is practically impossible to produce an accurate software model for verifying the interface with the parts on a chip or with devices outside the chip.

One solution to the above deficiencies is provided by known logic emulation systems. A typical logic emulation system involves first developing the logic of the target LSI in programmable devices such as field programmable gate arrays (FPGA's). These programmable devices are connected directly or via intermediate tools either to the board on which the actual LSI is to be mounted or on a similar board. The result is a prototype of the logical device.

The programmable devices are devices which are prepared without preparation of a mask and to which users may write logic circuits. The procedure above makes it possible to provide at a low cost a verification environment close to the actual implementation. Some programmable devices also permit rewrite operations thereto. This means that they allow the logic inside to be corrected according to the results of the verification. Where the quality of the logic circuits is assured to a sufficient degree, they may be used to debug software.

FIG. 16 is a schematic view of a hardware configuration constituting a conventional logic emulation system. FIG. 16 shows: a storage medium in which the logic data 101 is stored regarding a target LSI; a workstation or a personal computer 102; a programmable device writer 103; field programmable gate arrays (called the FPGA's hereunder) 104; an emulation board 105; and a verification board 106.

From the logic data 101, the workstation or personal computer 102 prepares data to be programmed into the FPGA's 104 for the emulation. The programmable device writer 103 writes the program data thus prepared to the FPGA's 104. The types and the quantity of FPGA's 104 are determined depending on the scale of the LSI logic to be verified. The emulation board 105 on which the FPGA's 104 are mounted allows the on-board parts to be wired in a programmable manner. This means that dedicated programmable devices may be used as well.

The verification board 106 is equivalent to the board of the target logical device except that the emulation board 105, instead of the LSI, is connected to the verification board 106. The FPGA's 104 may be mounted directly on the verification board 106.

FIG. 17 is a flowchart of steps for emulation processing by a conventional logic emulation system. In step 201 of FIG. 17, an editor or like device is used to input the logic of the logic circuits. In step 202, the logic to be verified is divided into a plurality of FPGA's 104 if the logic cannot be accommodated in a single FPGA 104. In step 203, where the logic is described at the register transfer level, logic synthesis is carried out to map the logic in the programmable devices in use (e.g., FPGA's).

In step 204, the devices are wired and in step 205, the result of the wiring is programmed into the devices. In step 206, the devices are used for verification. In step 207, a check is made to see if any defect has occurred. If a defect is detected, the logic is corrected and the processing is repeated from the input of the logic. In step 208, logic verification is terminated and the verified logic is implemented in the target LSI such as gate arrays.

SUMMARY OF THE INVENTION

The FPGA's used in a conventional logic simulation system as above-described have a structural disadvantage in that they operate at lower speeds than ordinary gate arrays. For this reason, logic designers working on the logic emulation system are required to take various measures in order to make the most of FPGA performance, especially where high-speed verification is needed.

One known way to maximize the operating speed of FPGA's effectively is the use of the so-called floor plan. To execute a floor plan involves outlining the layout of the FPGA's before they are wired in position. With the floor plan in place, functionally consistent logic blocks are each located in a certain region so that the wiring-induced delay time is minimized inside each block. Furthermore, the FPGA's are located in the appropriate regions so as to minimize the wiring length involved.

The floor plan technique is an indispensable step especially in designing ASIC's (application specific integrated circuits) that are required to operate at high speeds. However, to devise the floor plan requires its review by human intervention which has yet to be automated. That is, implementing a floor plan of FPGA's requires devising not only the floor plan of the gate arrays (i.e., the eventual target) but also the floor plan of the FPGA's. This involves substantial work in terms of man hours and consequently has proved to place a huge burden on LSI designers.

In addition, the target LSI needs to be verified for delays, and appropriate measures are required to be taken to counter such delays. The delay-related tasks involve first incorporating the logic into the FPGA's and then calculating the delay values of critical paths. If tolerable ranges are found to be exceeded, the logic is corrected accordingly. The delay values are generally calculated by an FPGA-mounted system.

In conventional logic synthesis, the logic synthesis system changes the names of the signals written by the logic designer in the logic data as the logic is being optimized or mapped in the target FPGA's. This makes it practically impossible, upon calculation of the delay values after logic incorporation into the FPGA's, to search for a path using signal names written in the logic data.

All of the above has led to the following problems. When a logic defect is detected during verification by the emulation system, that defect, if it is of a simple nature, may be corrected by directly altering the input data of the FPGA-mounted system without resorting to logic synthesis. However, since the signal names have been changed, the intended correction is very difficult to accomplish in the current state. That is, the logic data must be corrected and logic synthesis must be carried out again.

Generally, logic synthesis requires long hours of calculation. During that time, the verification process must be halted. The same holds when it becomes necessary to fix the logical value of a given signal temporarily in the course of verification.

It is therefore an object of the present invention to overcome the above and other deficiencies and disadvantages of the prior art emulation systems and to provide a program data creating method and apparatus for use with programmable devices in a logic emulation system, wherein the logic of a target LSI is allocated at least to one programmable device based on floor plan information regarding the actual LSI, whereby the speed of logic emulation is enhanced and the program data for the programmable devices is created and corrected efficiently.

It is another object of the present invention to provide a program data creating method and apparatus for use with programmable devices in a logic emulation system, wherein the names of the signals defined within the design data regarding the LSI are made to correspond with the names of the signals in effect when the design data is deployed within the programmable device, whereby the program data for the programmable devices is created and corrected efficiently.

These and other objects, features and advantages of the invention will become more apparent upon a reading of the following description and appended drawings. First, however, the principal aspects of the present invention and variations thereof will now be outlined.

(1) According to a first aspect of the invention, there is provided a program data creating method for use with programmable devices in a logic emulation system which creates program data for the programmable devices by optimizing logic data defining the logic circuits of an LSI, develops the logic circuits in the programmable devices on the basis of the program data, and verifies the logic circuits at least for performance and function using the programmable devices. This program data creating method comprises the steps of: dividing the logic data defining the logic circuits into a plurality of unit blocks constituting a layout analogous to the floor plan represented by floor plan information for allowing the logic circuits to be incorporated into the target LSI; and automatically allocating the unit blocks of the logic data at least to one of the programmable devices.

(2) In a preferred structure of the invention as defined in paragraph (1) above, the program data creating method further comprises the step of optimizing the logic data allocated at least to one of the programmable devices, thereby creating program data automatically for developing the logic circuits in the programmable devices.

(3) In another preferred structure of the invention as defined in paragraph (1) or (2) above, the program data creating method further comprises the steps of: storing signal name correspondence information allowing the names of signals used within the program data to correspond with the names of signals used within the logic data defining the logic circuits; allowing a signal name and a logic value to be designated regarding any one of the signals defined within the logic data defining the logic circuits; searching for that signal of the programmable devices which corresponds to the designated signal on the basis of the signal name correspondence information; and altering the program data in such a manner that the logic value of the designated signal is fixed by connecting the corresponding signal of the programmable devices either to a power supply or to ground.

(4) In a further preferred structure of the invention as defined in paragraph (1) or (2) above, the program data creating method further comprises the steps of: storing signal name correspondence information allowing the names of signals used within the program data to correspond with the names of signals used within the logic data defining the logic circuits; calculating the delay time of each of signals used by the programmable devices; and displaying, on the basis of the signal name correspondence information, the calculated delay times in correspondence with the names of the signals used within the logic data defining the logic circuits.

(5) According to another aspect of the invention, there is provided a program data creating apparatus for use with programmable devices in a logic emulation system which creates program data for the programmable devices by optimizing logic data regarding the logic circuits of an LSI, develops the logic circuits in the programmable devices on the basis of the program data, and verifies the logic circuits at least for performance and function using the programmable devices. This program data creating apparatus comprises: floor plan information inputting means for inputting floor plan information for allowing the logic circuits to be incorporated into the target LSI; and dividing and allocating means for dividing the logic data regarding the logic circuits into a plurality of unit blocks constituting a layout analogous to the floor plan represented by the floor plan information and for automatically allocating the unit blocks of the logic data at least to one of the programmable devices.

(6) In a preferred structure of the invention as defined in paragraph (5) above, the program data creating apparatus further comprises: optimizing means for optimizing the logic data allocated at least to one of the programmable devices; and program data creating means for creating the program data automatically for developing the logic circuits in the programmable devices.

(7) In another preferred structure of the invention as defined in paragraph (5) or (6) above, the program data creating apparatus further comprises inputting means for inputting performance information about the programmable devices, wherein the logic data is composed of a plurality of logic blocks; wherein the programmable devices are laid out in lattice fashion on a printed circuit board; and wherein the dividing and allocating means selects at least one programmable device which may be allocated to any one of the logic blocks, based on the layout of the logic blocks represented by the floor plan information as well as on the programmable device performance information, the dividing and allocating means further allocating automatically the logic blocks either collectively or individually to the selected programmable device.

(8) In a further preferred structure of the invention as defined in paragraph (5), (6) or (7), the program data creating apparatus further comprises applicable device displaying means for displaying all applicable programmable devices to which the logic data about the logic circuits may be allocated.

(9) In an even further preferred structure of the invention as defined in any one of paragraphs (5) through (8) above, the program data creating apparatus further comprises: signal name correspondence information storing means for storing signal name correspondence information allowing the names of signals used within the program data to correspond with the names of signals used within the logic data defining the logic circuits; and program data altering means for allowing a signal name and a logic value to be designated regarding any one of the signals defined within the logic data for defining the logic circuits, the program data altering means further searching, for that signal of the programmable devices which corresponds to the designated signal on the basis of the signal name correspondence information stored in the signal name correspondence information storing means, the program data altering means further altering the program data in such a manner that the logic value of the designated signal is fixed by connecting the corresponding signal of the programmable devices either to a power supply or to ground.

(10) In a still further preferred structure of the invention as defined in any one of paragraphs (5) through (8) above, the program data creating apparatus further comprises: signal name corresponding information storing means for storing signal name correspondence information allowing the names of signals used within the program data to correspond with the names of signals used within the logic data defining the logic circuits; delay time calculating means for calculating the delay time of each of signals used by the programmable devices; and delay time displaying means for displaying, on the basis of the signal name correspondence information stored in the signal name correspondence information storing means, the delay times in correspondence with the names of the signals used within the logic data defining the logic circuits, the delay times having being calculated by the delay time calculating means.

According to the invention as defined in any one of paragraphs (1), (2) and (5) through (8), the logic circuits of the LSI are divided automatically into a layout analogous to the floor plan based on the floor plan information for incorporating the logic circuits into the target LSI. The divided logic circuits are allocated to at least one programmable device. In addition, program data is automatically created for the programmable devices to accommodate the logic circuits therein according to the layout analogous to the floor plan in question.

There may be a case where the logic circuits of the LSI are to be allocated to several or even to dozens of programmable devices laid out in lattice fashion on the emulation board for verifying an LSI of a relatively large scale. In that case, the floor plan information regarding the LSI is input and the logic circuits are divided and allocated to each programmable device so as to constitute a layout analogous to the floor plan. The parts within each programmable device are then wired into position.

If the logic circuits of the LSI are allocated to a single programmable device, the floor plan for the LSI is used unmodified as the floor plan of that programmable device. The parts within the programmable device are then wired into position according to the floor plan. The floor plan information prepared for the target LSI is so designed as to maximize the logic performance and operations of the LSI as it is implemented on the programmable devices. The logic circuits are divided and allocated to the FPGA's which are then wired according to the above floor plan information. This makes it possible to enhance the operating speed of the FPGA's without devising another floor plan for them.

According to the invention as defined in any one of paragraphs (3), (4), (9) and (10), there is provided the signal name correspondence information storing means for storing signal name correspondence information allowing the names of signals used within the program data for developing the logic circuits in the programmable devices, to correspond with the names of signals used within the logic data defining the logic circuits of the LSI.

Suppose that the user, having positioned and wired the programmable devices or having performed verification by actually using the program data, designates the fixing of the logic value of a given signal in the logic data. In that case, the signal name correspondence information storing means makes it possible to search for that signal of the programmable devices which corresponds to the designated signal on the basis of the signal name correspondence information. This in turn allows the program data for the programmable devices to be altered in such a manner that the corresponding signal is connected to ground or to the power supply.

Likewise, given a programmable device path whose delay value has been calculated, the invention as defined above searches for the corresponding signal in the design data in accordance with the signal name correspondence information, to display the path-signal combination. In addition, it is possible to search for a programmable device signal corresponding to the user-designated signal name in the design data on the basis of the signal name correspondence information, and to calculate and display the delay value of the corresponding signal detected.

BRIEF DESCRIPTION OF THE DRAWINGS

FIG. 4 is a list showing exemplary contents of floor plan data indicated in FIG. 1;

FIG. 5 is a list showing exemplary contents of programmable device data indicated in FIG. 1;

FIG. 6 is a list showing exemplary contents of an applicable device list prepared by the emulation system of the embodiment;

FIG. 7 is a list showing exemplary contents of a signal name correspondence table prepared by the emulation system of the embodiment;

FIG. 8 is a list showing exemplary contents of a delay time list prepared by the emulation system of the embodiment;

FIG. 9 is a list showing exemplary contents of an inter-device network list prepared by the emulation system of the embodiment;

FIG. 10 is a list showing exemplary contents of layout and wiring data prepared by the emulation system of the embodiment;

DETAILED DESCRIPTION OF THE PREFERRED EMBODIMENTS

Figure 1:
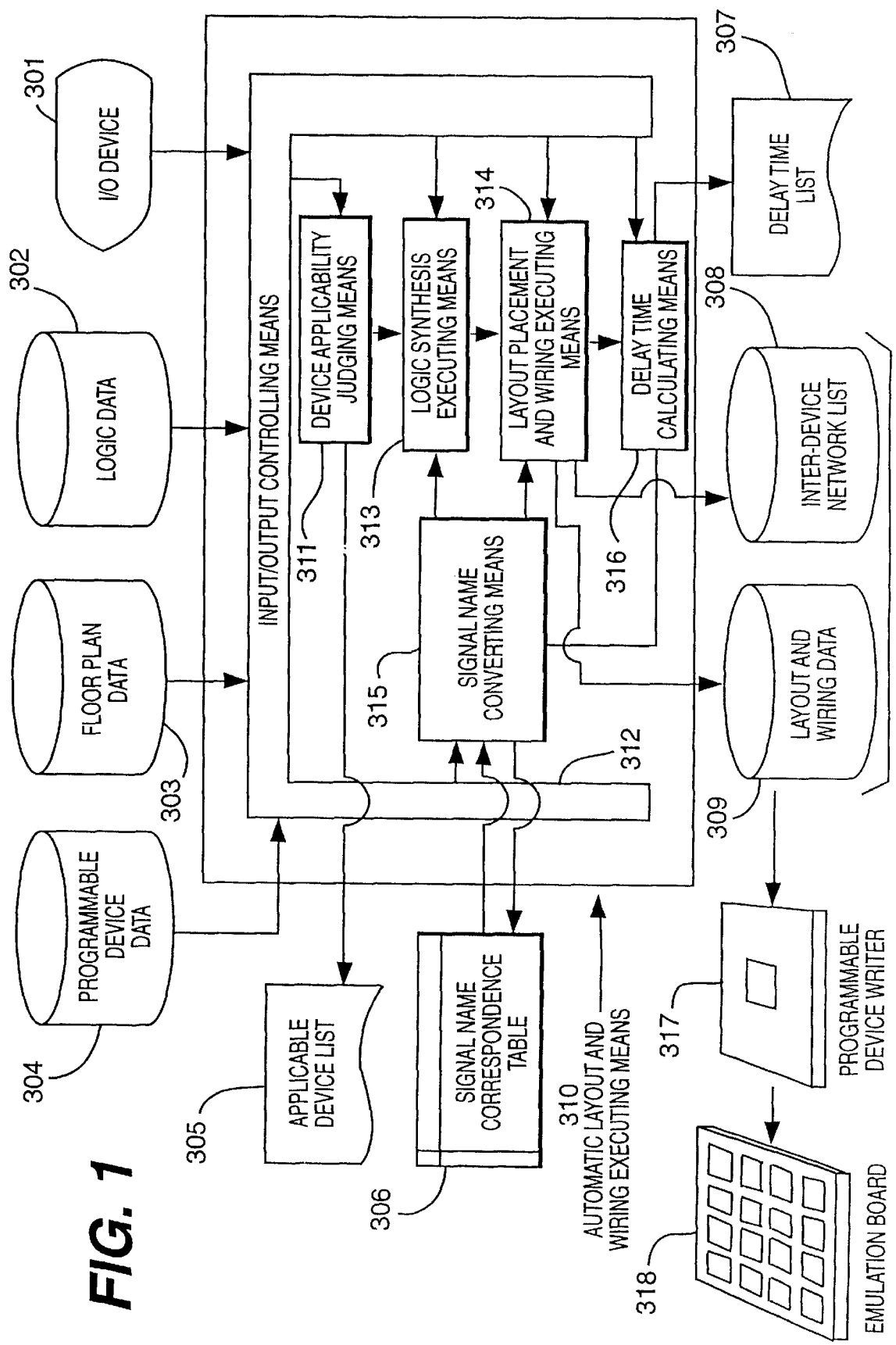
FIG. 1 is a block diagram outlining the structure of a logic emulation system embodying the invention.

A preferred embodiment of the present invention will now be described in detail with reference to the accompanying drawings. Throughout the drawings referenced in describing the embodiment, like reference characters designate like or corresponding parts, and therefore repetitive descriptions thereof are omitted.

FIG. 1 is a block diagram outlining the structure of a logic emulation system embodying the invention. FIG. 1 shows an input/output device 301; logic data 302; floor plan data 303; programmable device data 304; an applicable device list 305; a signal name correspondence table 306; a delay time list 307; an inter-device network list 308; layout and wiring data 309; automatic layout and wiring executing means 310; device applicability judging means 311; input/output controlling means 312; logic synthesis executing means 313; layout placement and wiring executing means 314; signal name converting means 315; delay time calculating means 316; a programmable device writer 317; and an emulation board 318.

The emulation system of this embodiment is a system that operates on a workstation or a personal computer. The user controls the system through the input/output device 301.

The automatic layout and wiring executing means constituting the core of this emulation system is composed of the device availability judging means 311, input/output controlling means 312, logic synthesis executing means 313, layout placement and wiring executing means 314, signal name converting means 315 and delay time calculating means 316.

Of the above components of the system, the automatic layout and wiring executing means 310, device applicability judging means 311, input/output controlling means 312, logic synthesis executing means 313, layout placement and wiring executing means 314, signal name converting means 315 and delay time calculating means 316 are functional means that may be implemented by software on the workstation or personal computer, it being understood that the software is stored on a storage medium and represents executable instructions that can be executed on a computer.

The input/output controlling means 312 controls the input and output of various data. The device applicability judging means 311 searches for devices to which the logic may be allocated. The search is carried out on the basis of the logic data 302, floor plan data 303 and programmable device data 304. With the applicable devices thus detected, the logic is suitably divided and allocated to them.

The result of the operation by the device applicability judging means 311 is output onto the applicable device list 305 for confirmation by the user. The logic synthesis executing means 313 optimizes the logic divided by the device applicability judging means 311. Furthermore, the logic synthesis executing means 313 maps the logic into the programmable devices.

Based on the result of the operation by the logic synthesis executing means 313, the layout placement and wiring executing means 314 lays out and wires the individual programmable devices. The result of the operation by the layout placement and wiring executing means 314 is output to the inter-device network list 308 as well as to the layout and wiring data 309.

The signal name converting means 315 stores into the signal name correspondence table 306 information about the signals converted by the logic synthesis executing means 313 and by the layout placement and wiring executing means 314. In referencing the signal information, the signal name converting means 315 searches for the converted signal name corresponding to a given signal name in the logic data 302. Conversely, the signal name converting means 315 also searches for that signal name in the logic data 302 which corresponds to a given converted signal name.

The delay time calculating means 316 calculates the delay times stemming from the result of the layout and wiring executed by the layout placement and wiring executing means 314. The delay times thus calculated are output onto the delay time list 307.

The programmable device writer 317 writes the inter-device network list 308 and layout and wiring data 309 into actual programmable devices such as the FPGA's.

Figure 2:
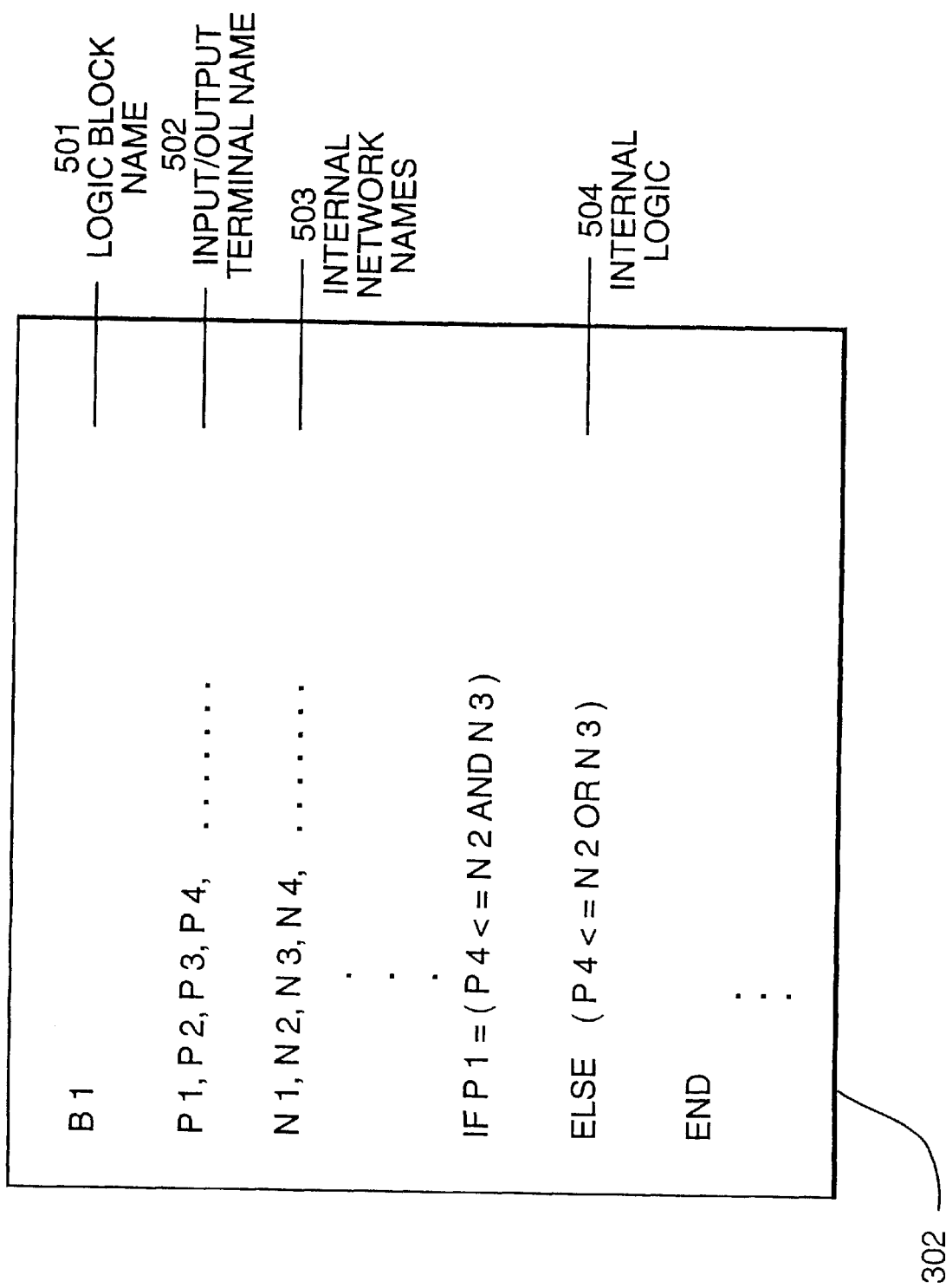
FIG. 2 is a view of a descriptive example of logic data indicated in FIG. 1.
Figure 3:
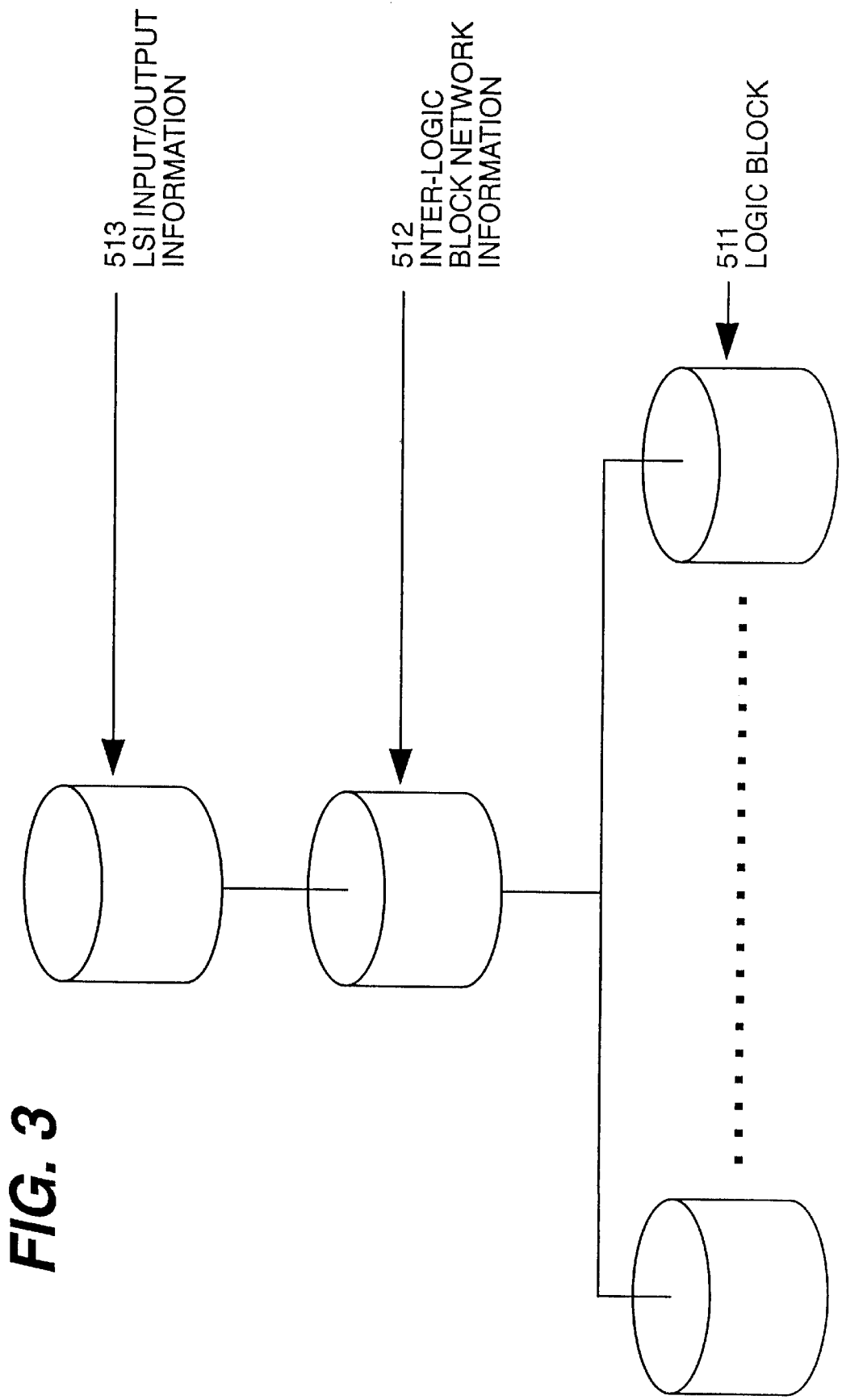
FIG. 3 is a schematic view showing a typical structure of the logic data in FIG. 1.

FIG. 2 is a view of a descriptive example of the logic data 302 indicated in FIG. 1. FIG. 3 is a schematic view showing a typical structure of the logic data 302 in FIG. 1. In the example of FIG. 2, the logic data 302 comprises a logic block name 501, input/output terminal names 502, internal network names 503 and internal logic 504 written in a hardware descriptive language.

As illustrated in FIG. 3, the logic data 302 is hierarchically structured. The bottom layer is constituted by logic blocks 511 having internal logic described therein. Above the bottom layer exists network data 512 about the logic blocks. The top layer is composed of input/output information 513 about the actual LSI.

FIG. 4 is a list showing exemplary contents of the floor plan data 303 indicated in FIG. 1. The floor plan data is prepared to address the eventual target LSI. In the example of FIG. 4, the floor plan data 303 contains block names 521 in the logic data 302, individual input/output terminal counts 522 of each block, logic scales 523 of the blocks, block locations 524, the total logic scale 525 for all blocks, and the total input/output terminal count 526 regarding all of the blocks.

It is assumed that the number of programmable devices that are mounted on the emulation board 318 is large enough to accommodate the logic scale of the target LSI (i.e., slightly larger than the estimate). It is also assumed that the device locations on the emulation board 318 are approximately compatible with the locations of the target gate arrays and other related parts.

Referring to FIG. 4, reference characters R and C in the block locations 524 in the floor plan data 303 represent a row and a column, respectively, used when the target gate arrays are divided into M rows and N columns. Reference characters <1–r> indicate the rows ranging from row 1 to row r, and <1–c> denote the columns ranging from column 1 to column c. As an example, the floor plan data 303 of FIG. 4 shows a case in which M and N are 12 each. Specifically, the block named B1 is located at R<1–8>, C<1–2>, which means that the block B1 occupies rows 1 through 8 and columns 1 and 2 where the gate arrays are divided into 12 rows by 12 columns. The block location 524, R<1-r>, C<1-c>in the floor plan data 303, also represents the location of a programmable device on the emulation board.

It is assumed that the value M is the least common multiple of the maximum number of programmable devices of each type mounted lengthwise on the emulation board 318 (e.g., 6 when the programmable device type is PD1; 5 when the type is PD2). Likewise, it is assumed that the value N is the least common multiple of the maximum number of programmable devices of each type mounted crosswise on the emulation board 318. This arrangement eliminates the need for altering the block locations 524 in the floor plan data 303 every time a different programmable device type is selected.

FIG. 5 is a list showing exemplary contents of the programmable device data 304 indicated in FIG. 1. In the example of FIG. 5, the programmable device data 304 includes programmable device types 531 each indicating candidate types of devices in which to place the logic data 302, input/output terminal counts 532 each denoting the number of input/output terminals that may be used by each type of the programmable devices, logic scales 533 each applicable to the corresponding device type, and mountable device counts 534 each indicating the number of programmable devices of the applicable type which may be mounted on the emulation board 318.

FIG. 6 is a list showing exemplary contents of the applicable device list 305 prepared by the emulation system of this embodiment. The applicable device list 305 is a list of programmable devices belonging to types that are judged to be applicable by the emulation system. In the example of FIG. 6, the applicable device list 305 comprises all programmable device types 541 that are judged to be appropriate for allocating the logic thereto, mounted programmable device counts 542, mounted device names 543, internal cell activity ratios 544, and input/output terminal counts 545 each indicating the number of input/output terminals used by the applicable device type.

FIG. 7 is a list showing exemplary contents of the signal name correspondence table 306 prepared by the emulation system of this embodiment. In the example of FIG. 7, the signal name correspondence table 306 is composed of each block name 551 in the logic data 302, signal names 552 defined in each logic block, and converted signal names 553 representing the names of the signals converted upon optimization or layout and wiring at the time of logic synthesis.

FIG. 8 is a list showing exemplary contents of the delay time list 307 prepared by the emulation system of this embodiment. In the example of FIG. 8, the delay time list 307 comprises signal names 561 defined in the logic data 302, wiring paths 562 applicable to the signals, and delay times 563 calculated by the emulation system.

FIG. 9 is a list showing exemplary contents of the inter-device network list 308 prepared by the emulation system of this embodiment. In the example of FIG. 9, the inter-device network list 308 includes network names 571 each indicating a network that connects devices, and source and sink device names 572 and 573 indicating the devices connected by the respective networks.

FIG. 10 is a list showing exemplary contents of the layout and wiring data 309 prepared by the emulation system of this embodiment. In the example of FIG. 10, the layout and wiring data 309 is made up of gate names 591 indicating the gates as the units that are installed in the programmable devices, input terminal names 592 representing the input terminals connected to the gates, and output terminal names 593 denoting the output terminals also connected to the gates.

With the emulation system of this embodiment, programmable devices of the same type are laid out in lattice fashion on the emulation board 318. Wiring resources vary between programmable devices depending on the number of input/output terminals of each programmable device mounted on the emulation board 318. However, it is assumed here that the emulation board 318 is compatible in terms of pins with all of the device types in the programmable device data 304 and that sufficient quantities of wiring resources are available.

Figure 11A:
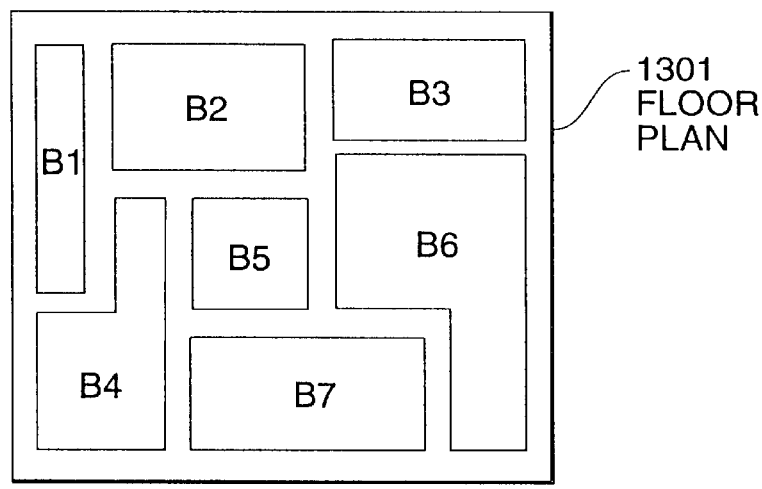
FIG. 11A is a floor plan described in the floor plan data for an LSI and FIG. 11B a layout of blocks after logic allocation by the automatic layout and wiring executed according to the present invention.
Figure 11B:
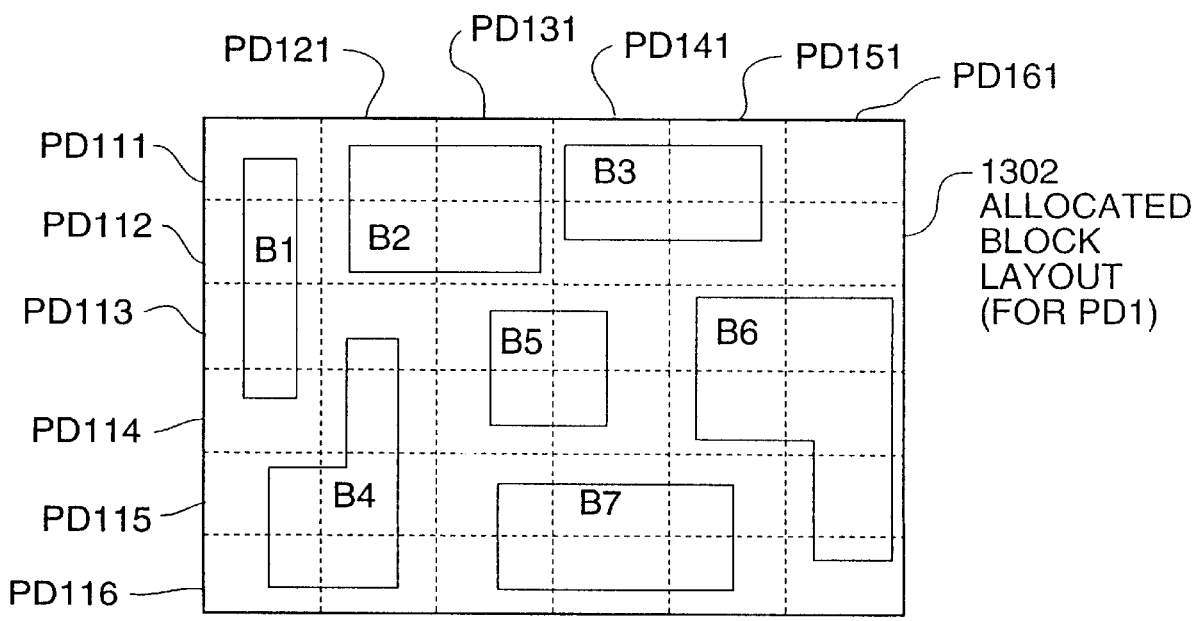
Figure 12A:
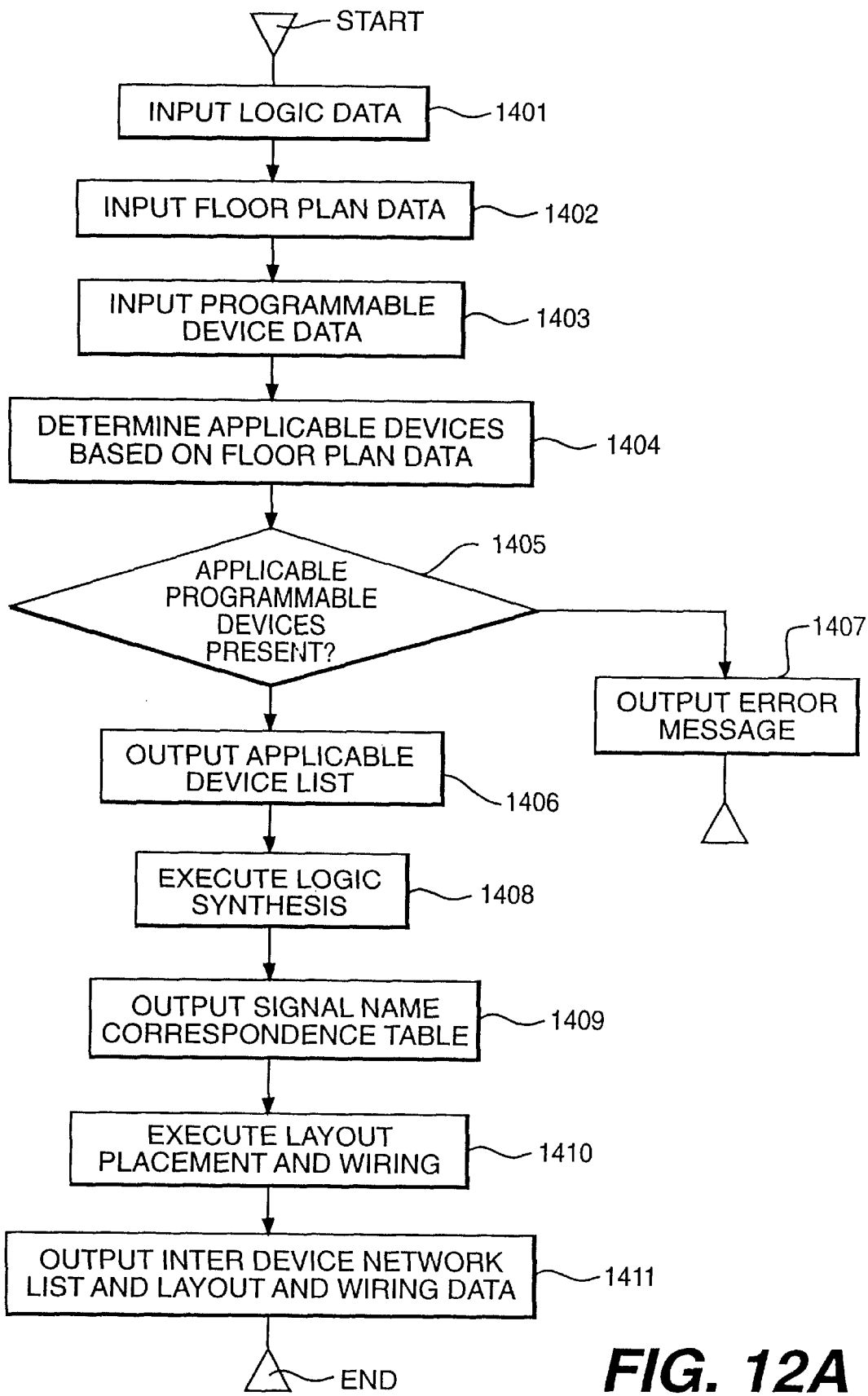
FIG. 12A is a flowchart of steps representing the processing by the automatic layout and wiring executing means 310 shown in FIG. 1.

FIG. 12A is a flowchart of steps representing the processing by the automatic layout and wiring executing means 310. How the automatic layout and wiring executing means 310 performs its processing will now be described with reference to a floor plan 1301 shown in FIG. 11A and the allocated block layout 1302 shown in FIG. 11B in addition to the flowchart of FIG. 12A.

In step 1401, a user's instruction given through the input/output device 301 triggers the input of the logic data 302 regarding the logic circuits of the target LSI. The input/output controlling means 312 forwards the logic data 302 to the device applicability judging means 311. In step 1402, the floor plan data 303 is similarly input. The input/output controlling means 312 also forwards the input data to the device applicability judging means 311.

The floor plan 1301 in FIG. 11A is an LSI-oriented floor plan described for the floor plan data 303. In FIG. 11B, reference characters B1 through B7 each indicate a block of logic to be accommodated in a specific region. In step 1403, the programmable device data 304 for allocation of the logic data 302 is similarly input. The input/output controlling means 312 forwards the programmable device data 304 to the device applicability judging means 311. In step 1404, the device applicability judging means 311 determines applicable programmable devices on the basis of the above three kinds of input data.

In step 1405, a check is made to see if applicable programmable devices exist. If such programmable devices are found to exist, step 1406 is reached in which the input/output controlling means 312 outputs an applicable device list. If no applicable programmable devices are found to exist, step 1407 is reached in which an error message is output. The processing then comes to an end. In step 1408, when applicable programmable devices are found to exist, the input/output controlling means 312 sends the result of step 1405 to the logic synthesis executing means 313 to execute logic synthesis.

In step 1409, the signal name converting means 315 generates a signal name correspondence table 306 that matches the signals converted or deleted upon optimization at the time of logic synthesis, with the signals defined in the logic data 302.

Figure 12B:
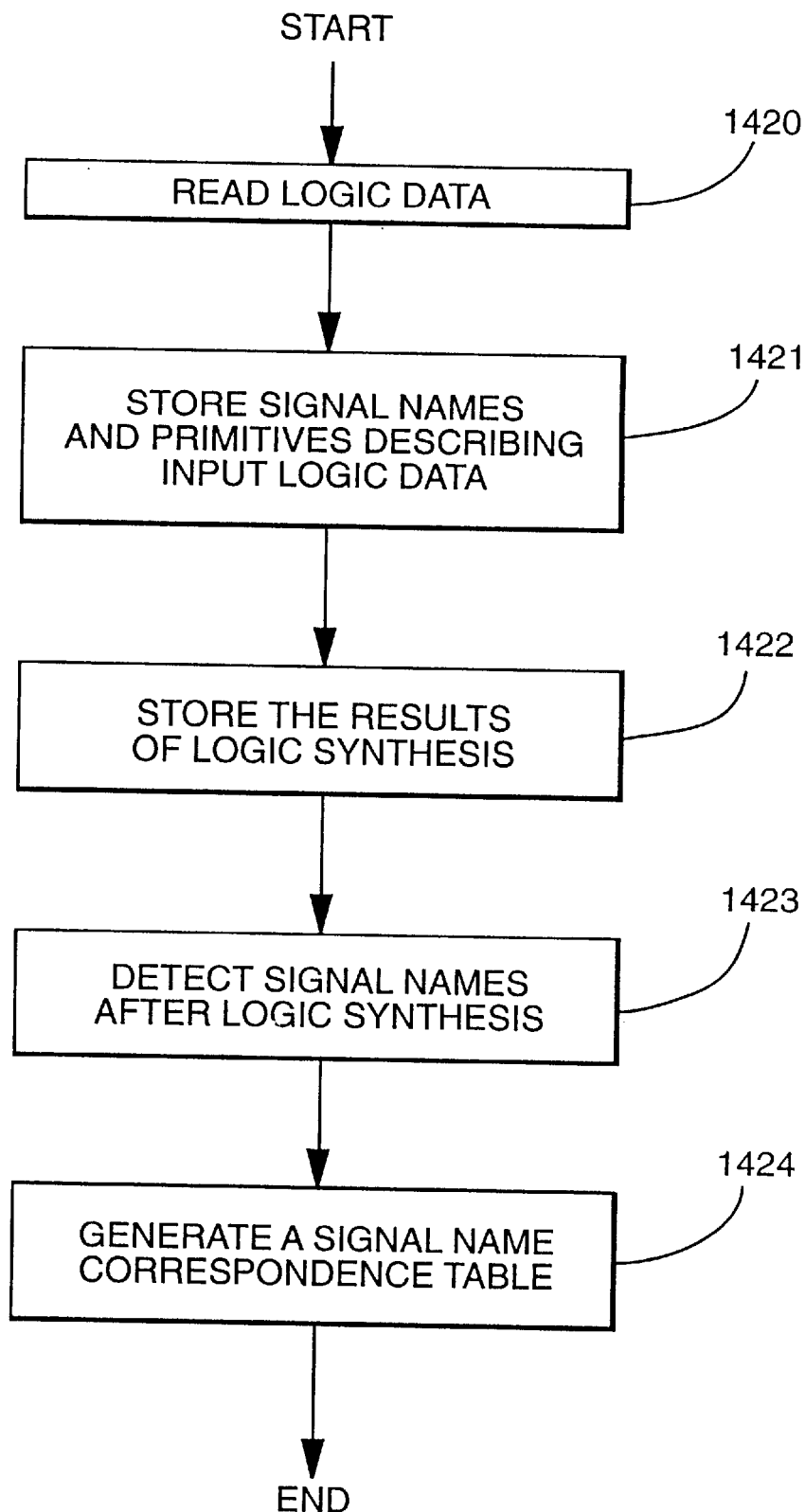
FIG. 12B shows the steps followed in generating a signal name correspondence table output in step 1409 in FIG. 12A.

FIG. 12B shows the steps followed in generating a signal name correspondence table, which is output in step 1409 in FIG. 12A. Specifically, in step 1420, a designer inputs instructions through I/O terminal 301 to make available logic data 302 regarding the logic circuits of the target LSI, which is read by the CPU. Then, in step 1421, the information of the signal names and the primitives, which are directly specified, i.e. flip flop circuit or buffer, are specified according to the designer's logic data. The primitives are names using the signal name connected to the output pin of the signal when a designer inputs the logic data 302.

In step 1422, information (the net list) of the connections between each signal and the primitives is determined by executing the logic synthesis. Following this is logic optimization, which logic often causes each signal name to be renamed or to be corrupted, but the primitives for the logic data are not removed. By using the primitives as the key words for each name in step 1421, information of the corresponding signal name can be obtained from the net list in step 1423.

In step 1424, a signal name correspondence table 306 is generated from the corresponding signal names set forth in step 1423 and the original signal names set forth in step 1421. This correspondence table is then output as a result of step 1409, shown in FIG. 12A.

With the logic synthesis process completed by the logic synthesis executing means 313, step 1410 is reached. In step 1410, the layout placement and wiring executing means 314 lays out and wires each programmable device using the result of the logic synthesis process. In step 1411, the layout placement and wiring executing means 314 prepares the layout and wiring data 309 and inter-device network list 308 for each programmable device, and causes the input/output controlling means 312 to output the data and the list.

The data thus prepared is programmed into the actual programmable devices by the programmable device writer 317. Emulation is now ready to be executed.

Figure 13:
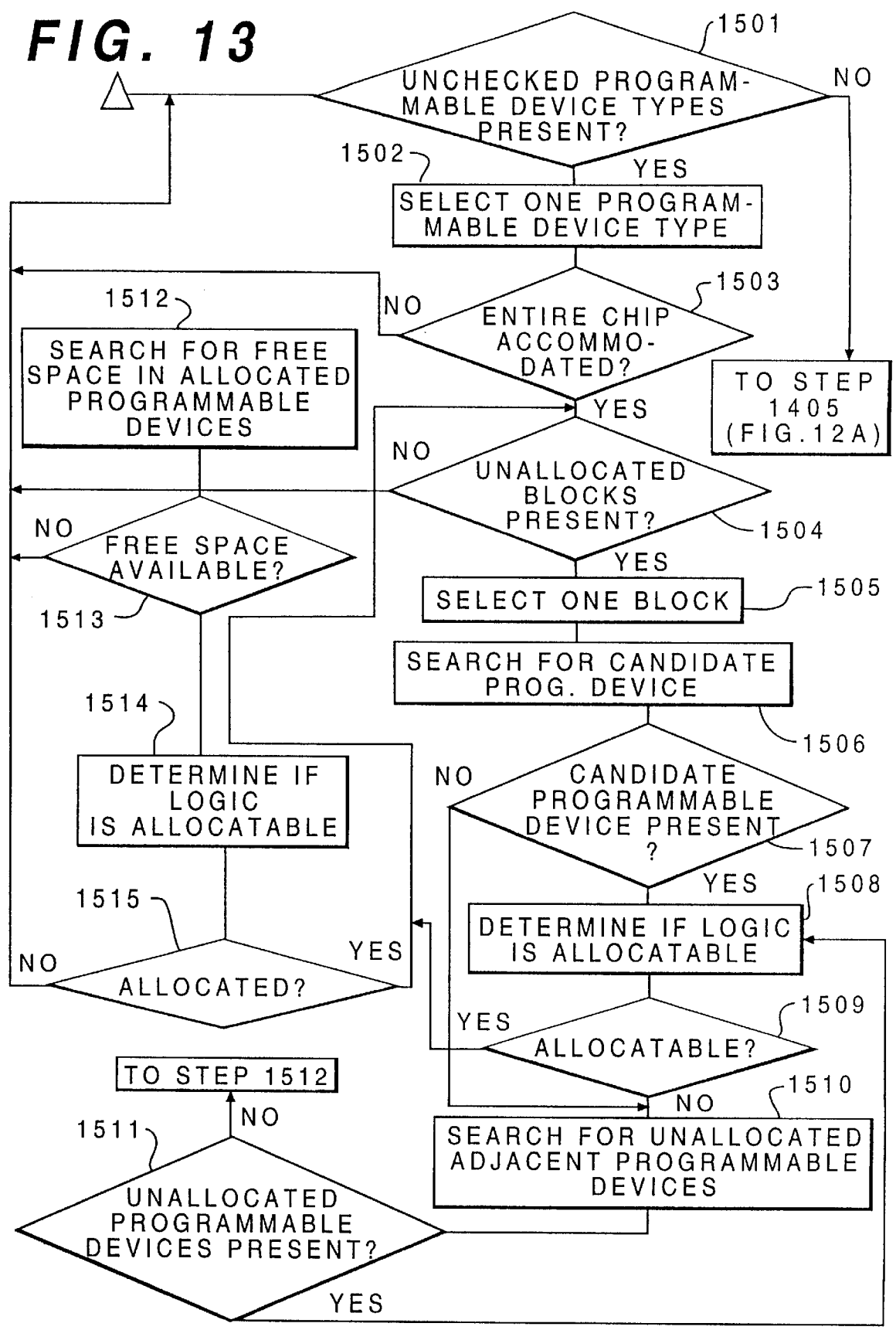
FIG. 13 is a flowchart of detailed steps carried out in the device applicability judging process of step 1404 in FIG. 12A.

FIG. 13 is a flowchart of detailed steps carried out by the device applicability judging means 311 when it acts in step 1404 of FIG. 12A. How the device applicability judging process of step 1404 in FIG. 12A takes place will now be described in detail with reference to the flowchart of FIG. 13.

In step 1501, a check is made to see if the programmable device data 304 includes any unchecked programmable device types. If such programmable devices are found to exist, one of the device types is selected in step 1502. In step 1503, a check is made to see if the selected device type will accommodate the entire logic scale of the LSI and the total input/output terminals thereof where the applicable programmable devices in their maximum quantities are mounted on the emulation board 318. If the maximum number of the applicable devices fails to accommodate the necessary resources, step 1501 is reached again. The next programmable device type is then taken up and processed.

In the examples of FIGS. 4 and 5, the programmable device PD1 offers a maximum mountable logic scale of 36K gates. Thus it is possible for the device type to accommodate the logic scale of 35.5K gates of the logic data 302. When the entire logic scale and the total number of input/output terminals are found to be accommodated by the maximum number of the applicable programmable devices, the logic is then allocated to these devices as the latter are mounted on the emulation board 318.

In steps 1504, 1505 and 1506, the block B1 in the floor plan 1301 is allocated. This is accomplished by first searching for unallocated programmable devices whose locations on the emulation board correspond to the position of the block B1. To find the programmable devices whose locations on the emulation board 318 correspond to the position of the block B1 requires the use of the block locations 524 in the floor plan data 303 shown in FIG. 4.

Specifically, where the target gate arrays are divided into M rows and N columns, the values M and N are divided respectively by values m (rows) and n (columns) representing the number of programmable devices mounted on the emulation board 318 (i.e., M÷m, N÷n). The results of the division are used to further divide the values r and c (i.e., r×m÷M, c×n÷N).

For example, suppose that the type of the programmable devices to be mounted on the emulation board 318 is PD1. With this device type, the maximum number of mountable programmable devices is 36. That is, six rows and six columns of the programmable devices PD1 are mounted on the emulation board 318. The values m and n are each 6 in this case, whereas M and N are each 12 in the example of FIG. 4. It follows that 12÷6=2, of which the result is used to divide the values r and c. For example, the coordinates R<1–8>, C<1–2> of the block B1 are turned into R<1–4>, C<1–1> after the division. This means that on the emulation board 318, the block B1 corresponds to the programmable devices located in rows 1 through 4 and in column 1.

In the setup 1302 of FIG. 11B, the programmable device PD111 is one of the applicable programmable devices. In step 1507, a check is made to see if an unallocated programmable device exists at the corresponding location. If such a programmable device is found to exist, step 1508 is reached. In steps 1508 and 1509, a check is made to see if the logic of the block B1 is allocatable to the programmable device in question, taking the corresponding input/output terminal count 522 and logic scale 523 into consideration.

If the logic is found to be allocatable to that device in steps 1508 and 1509, step 1504 is reached again. Then the next block B2 is processed in like manner. It may happen that the checking process in step 1508 fails to allocate the logic of the block B1 to the programmable device or that the logic is already allocated to the programmable device at the corresponding location. In such cases, an unallocated programmable device near the device in question is selected in step 1510. Then, a check is made in step 1511 to see if the logic of the block B1 may be allocated to that nearby programmable device.

In the typical allocated block layout 1302 of FIG. 11B, the nearby programmable devices are PD112 through PD114. In steps 1510 and 1511, it may happen that the logic of the block B1 is found to be allocatable to one of the nearby programmable devices. In that case, step 1504 is reached again, and the next block B2 is processed in like manner. In step 1510 and 1511, it may happen that the logic of the block B1 cannot be allocated to any of the nearby programmable devices. In that case, steps 1512 and 1513 are reached in which a check is made to see if there remains any free space available in any adjacent programmable devices. In steps 1514 and 1515, a check is made to see if the available programmable devices have a sufficient logic scale and spare input/output terminals to accommodate the block in question.

In the example of FIG. 11B, suppose that the programmable device PD121 is being addressed. In that case, programmable devices PD111 through PD114 as well as PD121 are checked for an available space that would accommodate the block B1. If the logic of the block B1 is found to be accommodated in the available space of the adjacent programmable devices, then the next block B2 is processed likewise. The judging process above is repeated for the blocks B3 through B7. If there exist no programmable devices in which to accommodate the logic, the applicability judging process on the current device type is terminated. Then step 1501 is reached again in which the next applicable programmable device type is selected, and the judging process is repeated.

When all blocks in the layout 1301 have been accommodated in the appropriate programmable devices in the above process, step 1501 is reached again. A check is again made in the manner above to see if an allocatable programmable device exists. When all program device types have been processed, the number of programmable devices to which the logic data 302 was actually allocated is calculated for each device type. The results of the calculations are displayed on the applicable device list 305.

The process above makes it possible to develop the logic circuits of the LSI under verification on the emulation board 318 carrying a plurality of programmable devices. During the above process, the logic is divided and allocated to the programmable devices in accordance with the floor plan for the target LSI. This eliminates the need for manually dividing the logic. As a result, the logic operations of the emulation board 318 in the inventive scheme are significantly faster than in the conventional practice of randomly splitting the logic. Also, since the applicable device list 305 is output on all programmable device types available, it is possible to select an optimum programmable device type for the logic circuits of the target LSI with the operating speeds of programmable devices taken into consideration.

Figure 14:
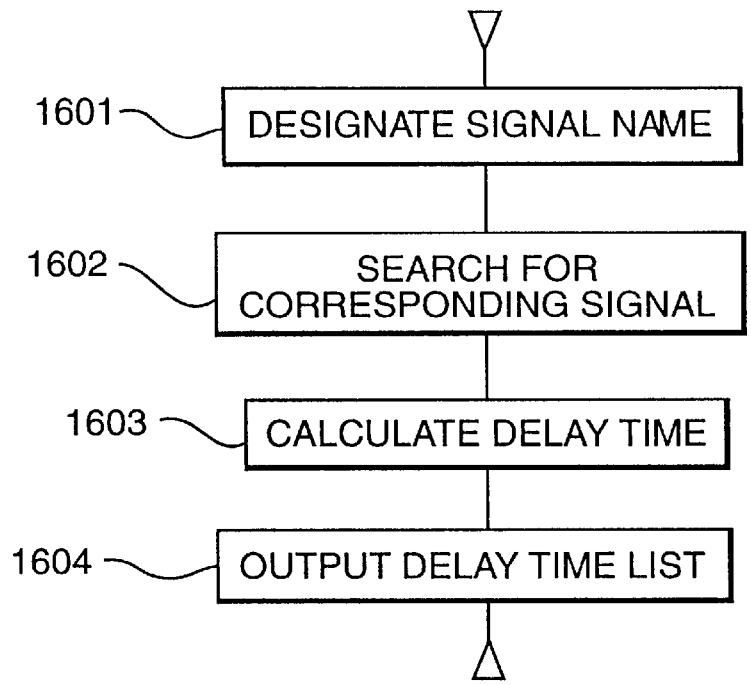
FIG. 14 is a flowchart of steps for calculating delay times in connection with the result of the layout and wiring executed by the layout and wiring executing means shown in FIG. 1.

FIG. 14 is a flowchart of steps for calculating delay times in connection with the result of the layout and wiring executed by the layout placement and wiring executing means 314. How to calculate the delay times resulting from the layout and wiring performed above will now be described with reference to the flowchart of FIG. 14.

In step 1601, the input/output device 301 is used to designate a given signal name. The input/output controlling means 312 informs the signal name converting means 315 of the designated signal. In step 1602, the signal name converting means 315 searches for the corresponding signal name and its wiring path on the basis of the signal name correspondence table 306. In step 1603, the input/output controlling means 312 forwards the result of the search to the delay time calculating means 316. The delay time calculating means 316 calculates the delay time with respect to the wiring path thus detected. The result of the calculation is displayed via the input/output controlling means 312 in step 1604. In like manner, not only specific signals but also those wiring paths of programmable devices which have delay times longer than a user-designated value may be displayed in correspondence with the logic data 302.

Figure 15:
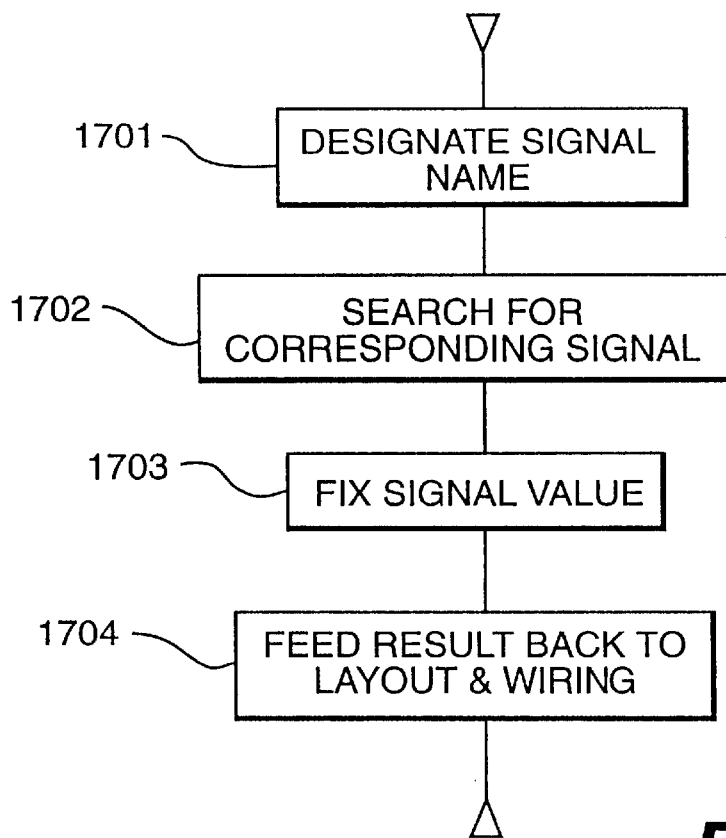
FIG. 15 is a flowchart of steps for carrying out logic emulation with a signal value fixed to a specific signal in logic data.
Figure 16:
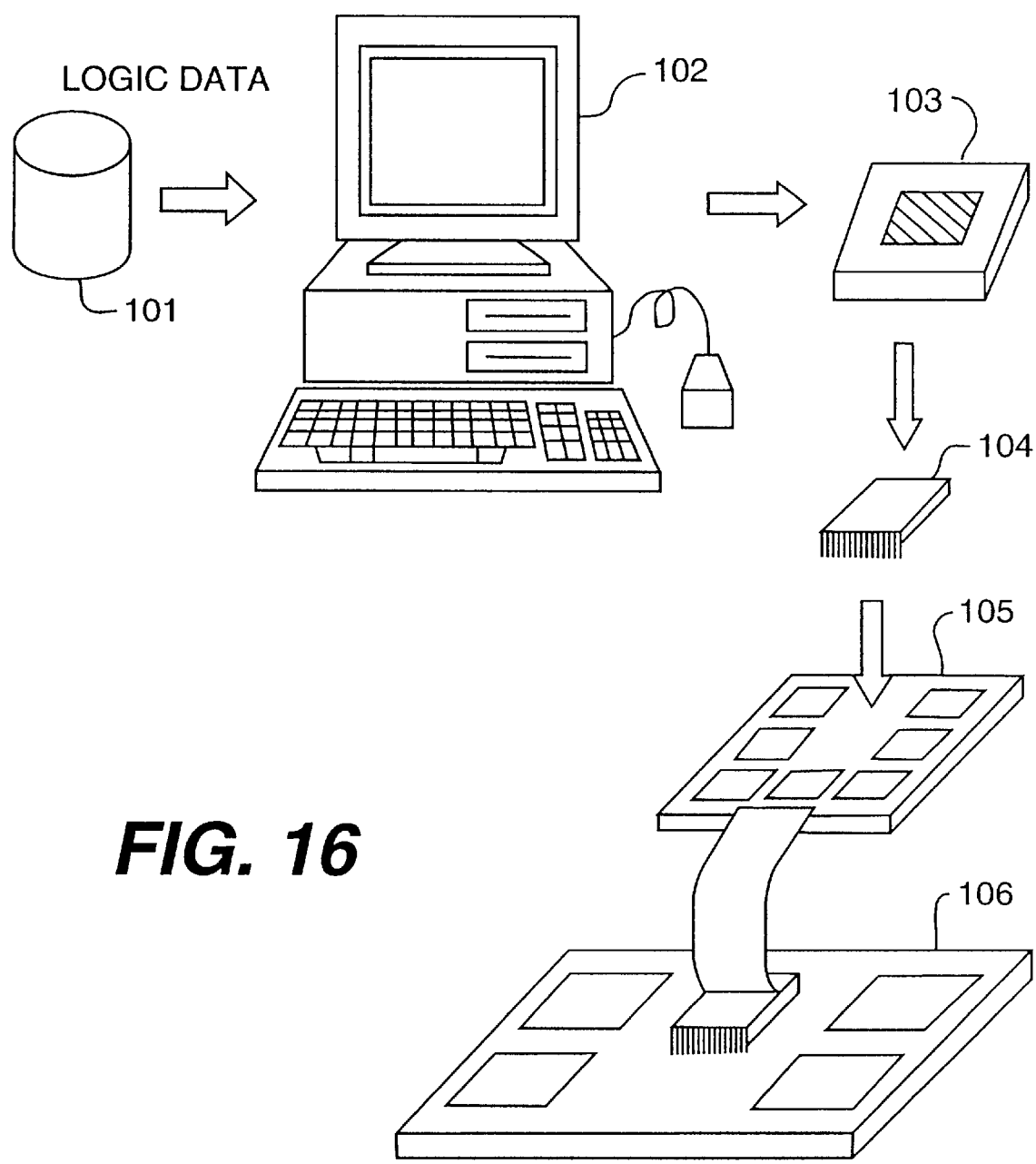
FIG. 16 is a schematic view of a hardware configuration constituting a conventional logic emulation system.
Figure 17:
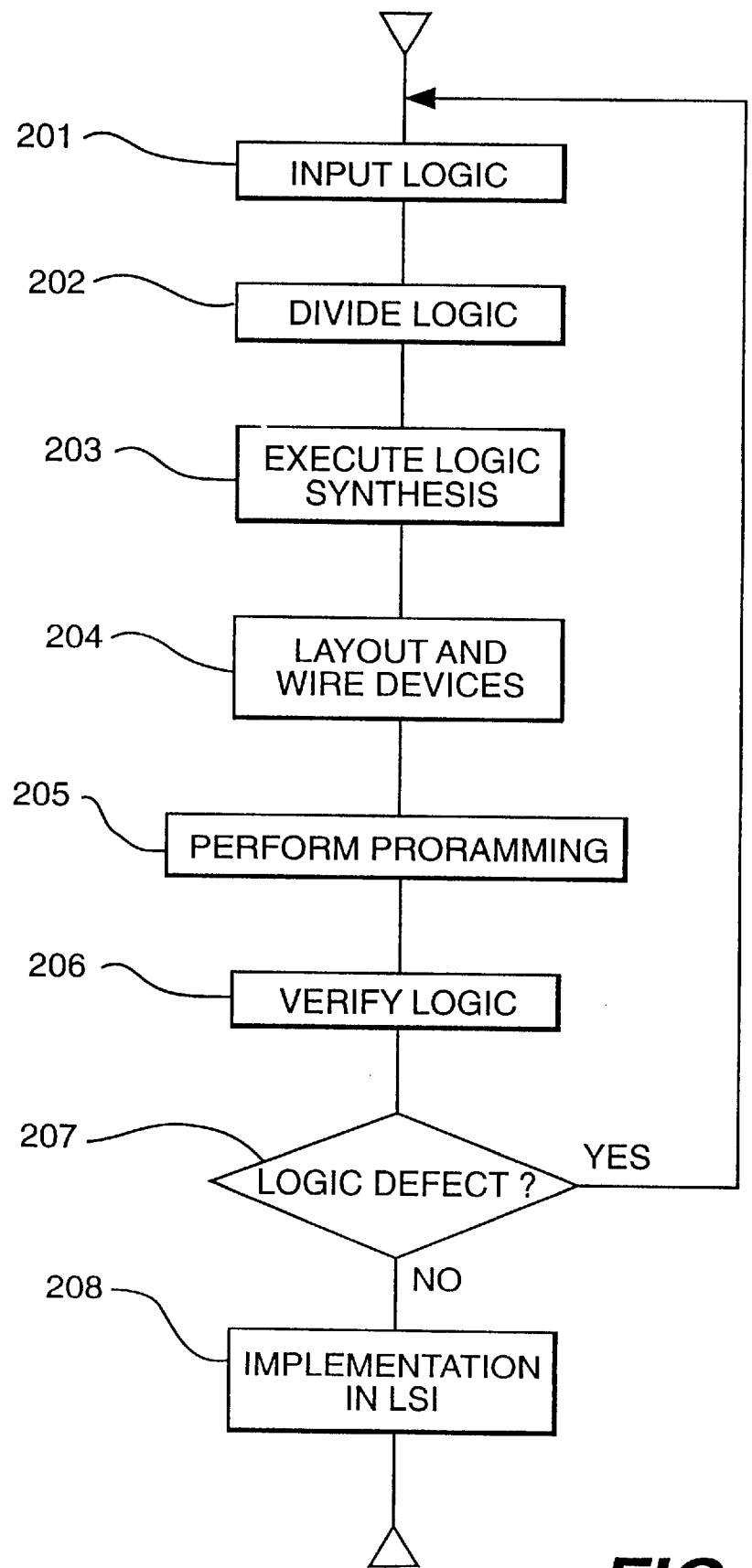
FIG. 17 is a flowchart of steps for emulation processing by a conventional logic emulation system.

FIG. 15 is a flowchart of steps for carrying out logic emulation with a signal value fixed to a specific signal in the logic data 302. How logic emulation is performed with a signal value fixed to a specific signal in the logic data 302 will now be described with reference to the flowchart of FIG. 15.

In step 1701, a given signal name is designated through the input/output device 301. The input/output controlling means 312 informs the signal name converting means 315 of the designated signal. In step 1702, the signal name converting means 315 searches for the corresponding signal name on the basis of the signal name correspondence table 306. The result of the search is sent to the layout placement and wiring executing means 314 by the input/output controlling means 312. In step 1703, the layout placement and wiring executing means 314 connects the designated signal to the power supply or to ground. In step 1704, the layout and wiring data 309 is corrected accordingly.

In the above two processes of FIGS. 14 and 15, the user has only to specify a signal name in the logic data 302. With the desired signal name designated, the corresponding programmable device signal is automatically searched for, and the corresponding delay time is calculated and the program data corrected accordingly. In this manner, the chores associated with emulation are carried out efficiently.

With this embodiment, there are a plurality of programmable devices to which to allocate the logic. The logic is allocated to the appropriate programmable devices in accordance with the floor plan information. The layout and wiring of each programmable device are carried out automatically by the layout placement and wiring executing means 314.

If only one programmable device is used, the floor plan information may be reflected in the layout and wiring inside that programmable device. More specifically, the layout of mounted modules constituting the programmable device may be implemented in accordance with the layout based on the floor plan information. In that case, the term "programmable devices" in the flowchart of FIG. 13 may be replaced by the expression "programmable elements of the programmable device," and the processing still holds.

The inventive method above allows the floor plan of the target LSI to be utilized unmodified as that of programmable devices. Without the need for devising another floor plan for the programmable devices, logic emulation is carried out at high speed. In the description above, the signal name correspondence table 306 is used to fix the value of a specific signal and to calculate the delay time thereof. Alternatively, a specific critical wiring path may be designated on the basis of the delay time calculations. That critical wiring path will then be given priority when wired.

While a preferred embodiment of the invention has been described using specific terms, such description is for illustrative purposes only, and it is to be understood that changes and variations may be made without departing from the spirit or scope of the claims that follow.

The major effects of the invention disclosed herein are summarized as follows:

(1) According to the invention, when the logic circuits of an LSI are allocated to one or a plurality of programmable devices, the logic circuits are divided automatically according to the floor plan information regarding the target LSI, and the programmable devices are laid out and wired also on the basis of that floor plan. This enhances the operating speed of the programmable devices in logic emulation and boosts the efficiency in preparing the data necessary for the emulation.

(2) According to the invention, the signal names defined in the logic data defining the logic circuits of the LSI are made to correspond with the signal names used by the programmable devices. The relations of such correspondence are utilized in calculating and outputting the delay times of specific signals and in correcting program data accordingly. This eliminates the need for manually checking the correspondence of signals between the logic data and the programmable devices. As a result, the operating speed of the programmable devices is improved and any defects detected from logic emulation are quickly dealt with.

We claim:

1. A program data creating method for use with programmable devices in a logic emulation system, comprising:
   creating program data for said programmable devices by optimizing logic data defining the logic circuits of an LSI;
   developing said logic circuits in said programmable devices on the basis of said program data and verifying said logic circuits at least for performance and function using said programmable devices;
   wherein said logic data defining said logic circuits is divided into a plurality of unit blocks constituting a layout analogous to a floor plan represented by floor plan information regarding an LSI, and wherein said unit blocks of said logic data are allocated to at least one of said programmable devices.

2. A program data creating method for use with programmable devices according to claim 1, further comprising the step of optimizing said logic data allocated at least to one of said programmable devices, thereby creating program data automatically for developing said logic circuits in said programmable devices.

3. A program data creating method for use with programmable devices according to claim 1, further comprising the steps of:

storing signal name correspondence information allowing names of signals used within said program data to correspond with names of signals used within said logic data defining said logic circuits; allowing a signal name and a logic value to be designated regarding any one of the signals defined within said logic data defining said logic circuits; searching for a corresponding signal of said programmable devices which corresponds to the designated signal on the basis of said signal name correspondence information; and selectively altering said program data;

wherein said selectively altering said program data further includes selectively altering said program data so that the logic value of said designated signal is fixed by connecting the corresponding signal of said programmable devices to one of a supply voltage and ground.

4. A program data creating method for use with programmable devices according to claim 1, further comprising the steps of:

storing signal name correspondence information allowing the names of signals used within said program data to correspond with the names of signals used within said logic data defining said logic circuits; and calculating the delay time of each of signals used by said programmable devices; and displaying, on the basis of said signal name correspondence information, the calculated delay times in correspondence with the names of the signals used within said logic data defining said logic circuits.

5. A program data creating apparatus for use with programmable devices in a logic emulation system which creates program data for said programmable devices by optimizing logic data regarding the logic circuits of an LSI, develops said logic circuits in said programmable devices on the basis of said program data, and verifies said logic circuits at least for performance and function using said programmable devices, comprising:

floor plan information inputting means for inputting floor plan information for said logic circuits of an LSI; and dividing and allocating means for dividing said logic data regarding said logic circuits into a plurality of unit blocks as a layout analogous to a floor plan represented by said floor plan information and for automatically allocating said unit blocks of said logic data at least to one of said programmable devices.

6. A program data creating apparatus for use with programmable devices according to claim 5, further comprising:

optimizing means for optimizing said logic data; and program data creating means for creating said program data automatically for developing said logic circuits in said programmable devices.

7. A program data creating apparatus for use with programmable devices according to claim 5, further comprising inputting means for inputting performance information about said programmable devices, wherein said logic data is composed of a plurality of logic blocks as said unit blocks; wherein said programmable devices are laid out in a lattice configuration on a printed circuit board; and wherein said dividing and allocating means selects at least one programmable device, based on a layout of said logic blocks represented by said floor plan information and on information concerning said programmable devices.

8. A program data creating apparatus for use with programmable devices according to claim 7, wherein said dividing and allocating means allocates automatically said logic blocks collectively to a selected one of the programmable devices.

9. A program data creating apparatus for use with programmable devices according to claim 7, further comprising applicable device displaying means for displaying all applicable programmable devices to which said logic data about said logic circuits may be allocated.

10. A program data creating apparatus for use with programmable devices according to claim 5, further comprising:

signal name correspondence information storing means for storing signal name correspondence information allowing the names of signals used within said program data to correspond with the names of signals used within said logic data defining said logic circuits; and program data altering means for allowing a signal name and a logic value to be designated regarding any one of the signals defined within said logic data for defining said logic circuits.

11. A program data creating apparatus for use with programmable devices according to claim 10, wherein said program data altering means further searches for one of said signals of said programmable devices which corresponds to the designated signal on the basis of said signal name correspondence information stored in said signal name correspondence information storing means, said program data altering means further altering said program data in such a manner that the logic value of said designated signal is fixed by connecting the corresponding signal of said programmable devices to one of a supply voltage and ground.

12. A program data creating apparatus for use with programmable devices according to claim 5, further including:

delay time calculating means for calculating the delay time of each of signals used by said programmable devices; and delay time displaying means for displaying, on the basis of said signal name correspondence information stored in said signal name correspondence information storing means, the delay times in correspondence with the names of the signals used within said logic data defining said logic circuits, said delay times having being calculated by said delay time calculating means; and delay time calculating means for calculating the delay time of each of signals used by said programmable devices; and delay time displaying means for displaying, on the basis of said signal name correspondence information stored in said signal name correspondence information storing means, the delay times in correspondence with the names of the signals used within said logic data defining said logic circuits, said delay times having being calculated by said delay time calculating means.

13. A program data creating method according to claim 1, wherein given a set of target gate arrays for said at least one of said programmable devices having M rows and N columns and wherein a number representing a total of such programmable devices that are mountable on an emulation board is equal to a total number, the method further comprising the steps of:

calculating m and n such that the total number of mountable programmable devices is equal to a product m·n; and calculating a new number of rows and columns by dividing a previously determined number of rows of the target gate arrays for said one of said programmable devices by M/m and by dividing a previously determined number of columns of the target gate arrays for said one of said programmable devices by N/n.

14. A program data creating apparatus according to claim 5, wherein given a set of target gate arrays for said at least one of said programmable devices having M rows and N columns and wherein a number representing a total of such programmable devices that are mountable on an emulation board is equal to a total number, the apparatus further comprising:

means for calculating m and n such that the total number of mountable programmable devices is equal to a product m·n; and means for calculating a new number of rows and columns by dividing a previously determined number of rows of the target gate arrays for said one of said programmable devices by M/m and by dividing a previously determined number of columns of the target gate arrays for said one of said programmable device by N/n.

15. A program data creating method according to claim 1, wherein a number of rows r and columns c are predetermined for said at least one of said programmable devices and wherein a target gate array is divided into M rows and N columns and wherein a number of such programmable devices mountable on an emulation board is represented by m rows and n columns, the method further comprising the step of:

determining a new set of rows and columns by dividing M and N by m and n, respectively, and then using a result of such division to further divide values of r and c such that the new set of rows and columns are respectively represented by r·m/M and c·n/N.

* * * * *